United States Patent
Tallal et al.

(10) Patent No.: US 10,797,111 B2
(45) Date of Patent: Oct. 6, 2020

(54) MATRIX DETECTION DEVICE INCORPORATING A METAL MESH IN A DETECTION LAYER, AND MANUFACTURING METHOD

(71) Applicant: COMMISSARIAT A L'ENERGIE ATOMIQUE ET AUX ENERGIES ALTERNATIVES, Paris (FR)

(72) Inventors: Jamal Tallal, Saint Aubin les Elbeuf (FR); Simon Charlot, Grenoble (FR); Anis Daami, Grenoble (FR); Jean-Marie Verilhac, Coublevie (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/309,272

(22) PCT Filed: Apr. 24, 2015

(86) PCT No.: PCT/EP2015/058941
§ 371 (c)(1),
(2) Date: Nov. 7, 2016

(87) PCT Pub. No.: WO2015/169623
PCT Pub. Date: Nov. 12, 2015

(65) Prior Publication Data
US 2017/0077186 A1 Mar. 16, 2017

(30) Foreign Application Priority Data
May 7, 2014 (FR) ..................... 14 54109

(51) Int. Cl.
*H01L 27/30* (2006.01)

(52) U.S. Cl.
CPC .......... *H01L 27/308* (2013.01); *H01L 27/307* (2013.01)

(58) Field of Classification Search
CPC ...................................... H01L 27/30
See application file for complete search history.

(56) References Cited

U.S. PATENT DOCUMENTS

| 4,449,044 A * | 5/1984 | Rotolante | H01L 27/14649 250/208.1 |
| 7,265,327 B1 * | 9/2007 | Park | H01L 27/14603 250/208.1 |

(Continued)

FOREIGN PATENT DOCUMENTS

| WO | 2007/017474 A1 | 2/2007 |
| WO | 2009/156419 A1 | 12/2009 |

OTHER PUBLICATIONS

Tse Nga Ng et al., "Flexible image sensor array with bulk heterojunction organic photodiode," Applied Physics Letters, vol. 92, 213303, 2008.

(Continued)

*Primary Examiner* — Sheng-Bai Zhu
(74) *Attorney, Agent, or Firm* — Baker & Hostetler LLP

(57) ABSTRACT

A matrix-array detecting device including a stack comprising a matrix array of detecting-element pixels, and an active matrix array comprising a network of rows and columns for controlling the pixels and produced on the surface of a substrate, wherein the detecting-element pixels comprise: a common top electrode; a detecting layer; and discrete bottom electrodes; the device comprising a metallic mesh that is connected to the top electrode; that includes pads comprising at least one metal portion, the pads being incorporated into the detecting layer; and that is positioned in correspondence with the network of controlling rows and (Continued)

columns. A process for fabricating the matrix-array detecting device is also provided.

8 Claims, 6 Drawing Sheets

(56) References Cited

U.S. PATENT DOCUMENTS

| | | | | |
|---|---|---|---|---|
| 2010/0148039 A1* | 6/2010 | Gratz | .................. | G01T 1/00 250/214 R |
| 2011/0108936 A1* | 5/2011 | Meng | .................. | G01L 1/005 257/419 |
| 2012/0037803 A1* | 2/2012 | Strickland | .............. | H01Q 1/425 250/338.1 |
| 2012/0206395 A1* | 8/2012 | Misaki | .................. | G06F 3/0412 345/173 |
| 2013/0048861 A1 | 2/2013 | Ohta et al. | | |
| 2013/0248822 A1* | 9/2013 | Gong | .................. | H01L 51/4266 257/26 |
| 2014/0218635 A1* | 8/2014 | Gao | .................. | G06F 1/1643 349/12 |
| 2014/0333855 A1* | 11/2014 | Park | .................. | G06F 3/041 349/12 |
| 2015/0249109 A1* | 9/2015 | Wang | .................. | H01L 27/14621 438/70 |
| 2016/0011703 A1* | 1/2016 | Park | .................. | G06F 3/047 345/174 |

OTHER PUBLICATIONS

Jean-Pierre Moy, "Large area X-ray detectors based on amorphous silicon technology," Thin Solid Films, vol. 337, 1999, pp. 213-221.

* cited by examiner

MATRIX DETECTION DEVICE INCORPORATING A METAL MESH IN A DETECTION LAYER, AND MANUFACTURING METHOD

CROSS-REFERENCE TO RELATED APPLICATIONS

This application is a National Stage of International patent application PCT/EP2015/058941, filed on Apr. 24, 2015, which claims priority to foreign French patent application No. FR 1454109, filed on May 7, 2014, the disclosures of which are incorporated by reference in their entirety.

FIELD OF THE INVENTION

The field of the invention is that of matrix-array detecting devices including an active matrix array integrating one or more controlling transistors coupled to a sensor. The transistor may be organic, inorganic or hybrid organic/inorganic in nature, the sensor possibly preferably being a printed photodiode type light sensor, a temperature sensor, a pressure sensor, etc.

BACKGROUND

As is known, in the field of commercial imagers for converting x-rays into visible images, the imager reading-out and optical acquiring circuit is composed as illustrated in FIGS. 1a and 1b, on the surface of a substrate 1, of an active matrix array of thin-film transistors Ti made of amorphous silicon (a-Si) connected to photodiodes Phi made of a-Si. Each TFT transistor (or group of transistors) Ti controls a pixel pad on which is stacked a photodiode device made of a-Si. The topmost electrode of each photodiode consists of a pad made of TCO (transparent conductive oxide), each pad being localized spatially and disconnected from its neighbors. In order to electrically bias all the TCO pads with respect to one another and to the same bias, very thin metal buses Bi (of a few 10ths of a µm in width) connect all the pads to one another, as illustrated in FIG. 1a. In a diode plot, the area of the opaque metal buses is negligible with respect to the area of the diode made of transparent TCO. In addition, the design of the metal bus lines allows the parasitic capacitances at the intersections between the buses and columns to be minimized (as described in the article Thin Solid Films 337, 213-221 (1999)). FIG. 1b is a schematic showing a cross-sectional view of the photodiodes Phi, which comprise discrete electrodes 4, photoconductive layer elements 5, and top electrodes 6 on which the buses Bi are placed. The elements 2 represent rows/columns for controlling the detecting pixels, which are isolated via a dielectric layer 3 from the discrete electrodes 4.

These TFT matrix arrays and a-Si photodiodes are fabricated using conventional microelectronic techniques:

vacuum deposition techniques are used to deposit the various layers forming the stack;

photolithography techniques are used to spatially localize these layers of material in order to minimize electrical coupling and parasitic capacitances between the pixels and between the various contact levels.

A promising alternative in terms of ease of processing and cost consists in producing a hybrid organic/inorganic active matrix array. The principle is to start with a commercially available TFT-based active matrix array made of a-Si for example and to replace the a-Si photodiode with an organic photodiode having one or more levels printed by wet processing (Applied Physics Letters 92, 213303 (2008)). The bottom electrode of the photodiode consists of the TCO pixel pad connected to the controlling transistor; next, in succession, an organic photoconverting layer composed of a blend of two electron donor/acceptor materials and lastly the top electrode are deposited.

In this case, conventional photolithography technologies cannot easily be applied to the printed organic layers especially for reasons of solvent incompatibility between the layers. It is thus more advantageous not to spatially localize these layers and therefore to print them on the wafer scale. Unfortunately, this may result in the creation of parasitic effects, such as inter-pixel electrical leakage or capacitive coupling between the rows/columns of the active matrix array and the top electrode, adversely affecting correct operation of the device. Specifically, when it is desired to read out the information present at the terminals of a pixel of an active matrix array, the transistor is turned on in order to allow a read-out to be taken between the bottom terminal of the diode and the wafer-scale top electrode. This read-out may be degraded or even corrupted by these parasitic capacitances.

In addition to problems with parasitic effects, there is also a parameter that is important when producing active matrix arrays: the resistivity of the top electrode of the photodiode. Specifically, during the acquisition of the images, a high resistivity will cause problems, especially with lag effects, which adversely affect correct device operation. Conventional x-ray imagers are composed of matrix arrays for photodetecting in the visible, which arrays are coupled to a scintillator for converting the x-rays into visible light. To increase detection resolution, which is generally characterized by a modulation transfer function (MTF), the scintillator is placed on the photodiode-side, this requiring the top electrode of the photodiode to be transparent. In addition, in many devices, the contact to the top electrode is redistributed to one or more localized points on the periphery of the carrier. This is amply sufficient in the case of a top electrode having a low sheet resistance ($<1\Omega/\square$).

In the case of photodiodes made of a-Si, a top electrode made of TCO is used in combination with metal buses that are not transparent but of negligible area with respect to the area of the diode. This makes it possible to reconcile both the need for electrode transparency and the need for a very low sheet resistance.

In the case of photodiodes the top electrode of which is printed on the wafer scale, the constraints on the top electrode are the same. Unfortunately, in the field of organic photodetectors, it is difficult to find materials that are at the same time very electrically conductive, transparent, and depositable on an organic layer using printing techniques the solvent of which is compatible with that used for the photosensitive layer. One of the products that best meets all these various prerequisites is PEDOT:PSS, but the sheet resistances proposed by manufacturers remain at the present time just below $100\Omega/\square$ (Orgacon IJ-1005). Over small areas this resistivity may be acceptable, but when it is desired to produce matrix arrays of pixels over areas larger than $50\times50$ mm$^2$ it becomes paramount to decrease this sheet resistance.

It is thus important to find ways of decreasing the resistivity of the printed top electrode, and of decreasing the parasitic capacitances between this top electrode and the rows/columns of the active matrix array.

In this context, the solution of the present invention allows these two problems to be solved.

SUMMARY OF THE INVENTION

More precisely, one subject of the present invention is a matrix-array detecting device including a stack comprising a matrix array of detecting-element pixels, and an active matrix array comprising a network of rows and columns for controlling said pixels and produced on the surface of a substrate, characterized in that:
the detecting-element pixels comprise:
a common top electrode;
a detecting layer; and
discrete bottom electrodes;
said device comprising a metallic mesh:
that is connected to said top electrode;
that includes pads comprising at least one metal portion, said pads being incorporated into said detecting layer; and
that is positioned in correspondence with said network of controlling rows and columns.

Generally, in the present invention, a discrete electrode is defined as being one per pixel and isolated from its neighbors, and a common electrode is defined as being an electrode common to at least two pixels.

According to one variant of the invention, the detecting layer is a common detecting layer, i.e. a layer making direct contact from one pixel to the next.

According to one variant of the invention, the detecting pixels are photodiodes.

According to one variant of the invention, the metallic mesh is separated from the network of controlling rows and columns by a dielectric layer of relative permittivity lower than about 2.5.

According to one variant of the invention, said pads comprise a metal top portion and a bottom portion made of dielectric.

According to one variant of the invention, the bottom portion of said pads includes a positive photoresist.

According to one variant of the invention, the detecting-element pixels comprise one or more organic materials.

According to one variant of the invention, the organic material is a blend of p-type polymer and n-type polymer.

According to one variant of the invention, the network of rows and columns for controlling said pixels is connected to a network of controlling transistors.

Another subject of the invention is a process for fabricating a matrix-array detecting device, including a matrix array of detecting-element pixels, and an active matrix array comprising a network of rows and columns for controlling said pixels and produced on the surface of a substrate and covered with a dielectric layer, characterized in that it includes the following steps:
producing discrete bottom electrodes;
depositing at least one detecting layer on the surface of said bottom electrodes; producing a metallic mesh:
that includes pads comprising at least one metal portion, said pads being incorporated into said detecting layer; and
that is positioned in correspondence with said network of controlling rows and columns; and
producing a common top electrode connected to said pads of the metallic mesh.

It will be noted that the detecting layer may be deposited in the form of a single layer or indeed it is possible to localize it for each pixel, for example by screen printing.

According to one variant of the invention, the process comprises the following steps:
producing a stack of layers by depositing:
what is called a bottom layer of positive photoresist encapsulating said discrete bottom electrodes of the elementary pixels;
a metal layer; and
what is called a top layer of positive photoresist on the surface of said metal layer;
exposing said stack and developing said what is called top resist so as to leave behind pads made of said what is called top resist;
etching said metal layer so as to form pads comprising a top portion made of resist and a metal portion;
etching a top layer formed from top resist and from bottom resist so as to form pads comprising a metal portion and a bottom portion made of resist;
producing a detecting layer located between said pads and leaving uncovered the top surface of said pads; and
depositing a top electrode layer on said detecting layer and making contact with said formed pads, allowing a metallic mesh connected to said top electrode and incorporated in said detecting layer to be produced, said mesh being positioned in correspondence with said network of controlling rows and columns.

According to one variant of the invention, said positive resist is exposed from the back side of said substrate, i.e. the side opposite the surface comprising said network of controlling rows and columns, said metal layer being such that it lets some of the exposing radiation pass.

According to one variant of the invention, the exposure is also carried out from the front side opposite said back side, in the presence of a mask containing what are called mask apertures, which apertures are positioned facing said bottom electrodes.

According to one variant of the invention, the process furthermore comprises:
depositing a negative resist after said pads comprising a metal top portion have been produced;
exposing said resist so as to define secondary apertures in said negative resist, on the surface of said metal pads; and
growing metal in said secondary apertures so as to increase the height of said metal pads.

According to one variant of the invention, the metal is grown electrolytically.

According to one variant of the invention, if the detecting layer covers said pads, the process furthermore comprises:
producing apertures in said detecting layer in correspondence with the network of rows and columns; and
depositing a top electrode layer on said photoresist layer and making contact with said formed pads and in said apertures, allowing a metallic mesh connected to said top electrode and incorporated in the surface of said detecting elements to be produced, said mesh being positioned in correspondence with said network of controlling rows and columns.

According to one variant of the invention, the process comprises a step of de-wetting the detecting layer on the pads having at least one metal portion allowing a direct contact of the top electrode with said pads, without a prior step of producing one or more apertures in said detecting layer (this type of aperture possibly being produced by laser ablation).

According to one variant of the invention, the de-wetting step comprises grafting a self-assembled monolayer on the pads comprising at least one metal portion in order to de-wet the detecting layer in this location and to allow direct contact to be made between said pads and said top electrode without a step of producing one or more apertures in said detecting layer.

Thus, one subject of the present invention is a matrix-array detecting device allowing two problems regularly encountered during the fabrication of detecting matrix arrays, and especially of the detecting matrix arrays of organic photodetectors with non-localized layers, to be solved, namely:

the presence of parasitic capacitances between the controlling rows/columns and the wafer-scale top electrode of the photodiode; and the high sheet resistance of the printed transparent top electrode of the organic photodetectors.

In the context of the present invention, the resistivity of the top electrode is decreased by forming a metallic mesh that, because of the way in which it is produced (exposure of a resist through opaque zones of the matrix array) is a conformal copy of the design of the opaque zones of the active matrix array (rows, columns, TFT). This mesh is therefore located facing the rows and columns.

The matrix-array detecting device of the invention includes a dielectric layer between the controlling rows/columns and the metallic mesh. Advantageously, a dielectric layer of low relative permittivity (2.5 at most) allows the parasitic capacitances between the various conductor levels to be decreased.

BRIEF DESCRIPTION OF THE DRAWINGS

The invention will be better understood and other advantages will become apparent on reading the following non-limiting description that is given with reference to the appended figures, in which.

DETAILED DESCRIPTION

Figure 1A:
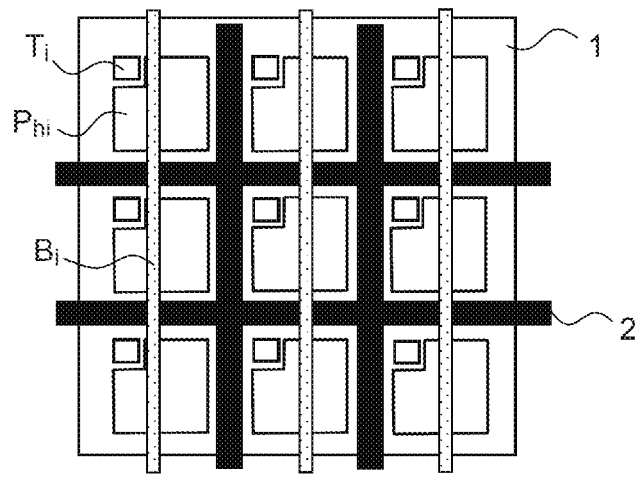
FIGS. 1a and 1b illustrate an exemplary imager according to the prior art.
Figure 1B:
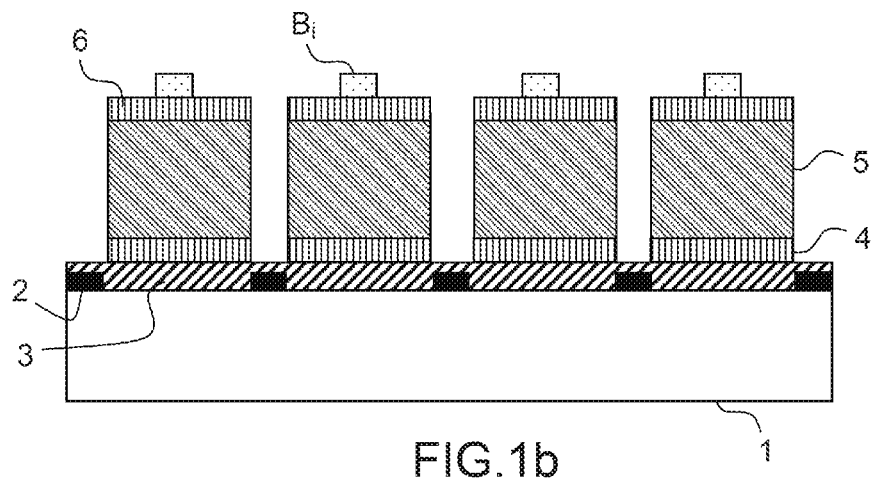
Figure 2:
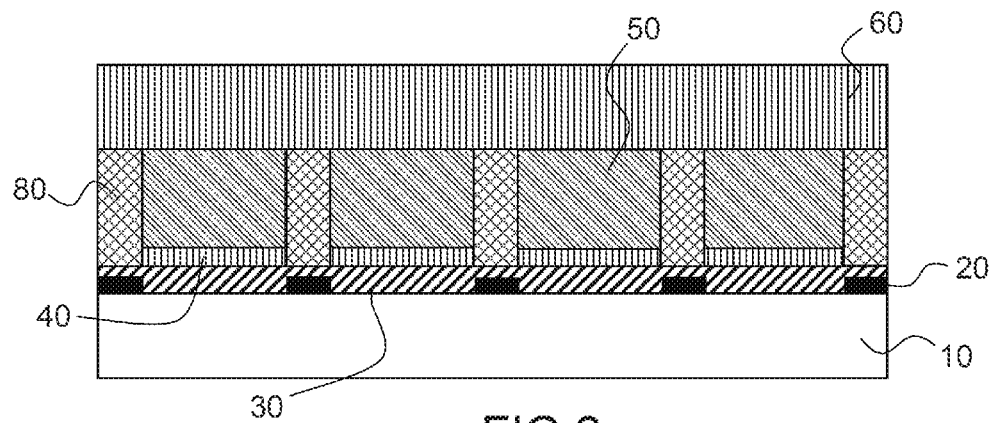
FIG. 2 illustrates an exemplary matrix-array detecting device according to the invention.

A schematic of a matrix-array detecting device of the present invention is illustrated in FIG. 2. It comprises, as is conventional, on the surface of a substrate 10, a matrix array of transistors (not shown) that are connected to rows/columns 20 for controlling the detecting pixels. It will be recalled that the controlling rows/columns allow the transistor of each pixel to be activated and that each transistor allows one detecting pixel to be controlled/read.

The detecting pixels comprise:
discrete bottom electrodes 40;
a detecting layer 50;
a top electrode that is common to said pixels 60.

A dielectric layer 30 insulates the conductive rows and columns 20 from the bottom electrodes 40.

According to the present invention, a mesh, which is what is called a metallic mesh, comprising pads 80 that are at least partially made of metal, is provided. The pads 80 of the metallic mesh are positioned in correspondence with, i.e. facing, the network 20 of controlling rows/columns and insulated therefrom, and separate the elements of the detecting layer 50 while making contact with said layer 50. This configuration is particularly advantageous in the case of matrix array devices including photodetecting elements, in which devices it is sought to optimize and therefore decrease the size of zones opaque to the radiation that it is sought to detect.

Exemplary Process for Fabricating a Matrix Array Photodetecting Device According to the Invention This process essentially details the production of the photodetector portion, the matrix arrays of transistors, the controlling rows/columns and the bottom electrodes of the photodetection portion having already been prefabricated on the surface of a substrate.

FIGS. 3a to 3l show the various steps of the fabricating process of the invention.

First Step

Figure 3A:
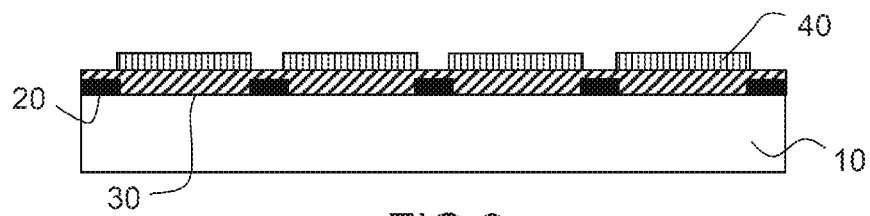
FIGS. 3a to 3l illustrate the various steps of a first exemplary process for producing a device of the invention.

As shown in FIG. 3a, the controlling rows/columns 20 and the bottom electrodes 40 of the photodetecting elements are produced on a substrate 10, the insulation between transistors and photodetectors being achieved by a dielectric insulating layer 30. The rows/columns are generally produced by vacuum deposition of a conductive layer (aluminum, molybdenum, etc.) followed by a step of photolithography and etching. The insulating layer is generally of SiN (silicon nitride) and deposited by a vacuum deposition technique. Lastly, the bottom electrodes are generally of transparent conductive oxides such as ITO (indium tin oxide) and deposited by PVD (physical vapor deposition) followed by a photolithography step.

Second Step

Figure 3B:
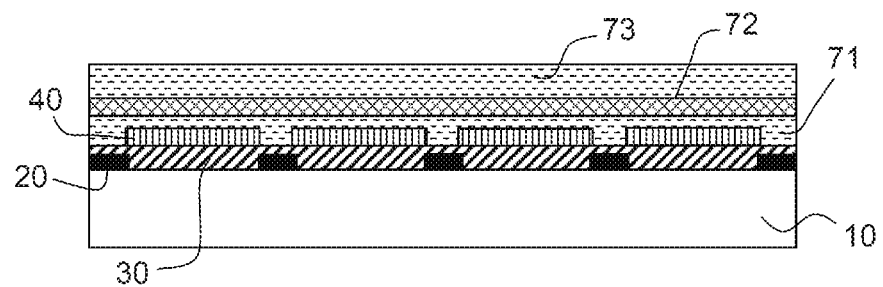

As shown in FIG. 3b, the following are deposited in succession on the preformed base:

a positive photoresist 71, for example S1818 from Shipley. This type of resist generally consists of 3 components: a polymer resin matrix (Novolak), a photoactive compound (diazo-compound, generally diazonaphthoquinone) and a PGMEA (propylene glycol monomethyl ether acetate) solvent. The thickness of this layer may vary from a few nanometers to several microns, and ideally is about 1 to 2 µm. The deposition may be carried out by spin coating (at 2000 rpm (revolutions/minute) for 30 seconds for a final thickness of 1.2 µm) or using any other resist deposition technique, followed by a post-deposition anneal at 115° C. for 5 minutes under $N_2$;

a low-resistivity metal layer 72 of resistivity lower than 100Ω/□, and better still than 10Ω/□, and ideally lower than 1Ω/□, its resistance easily being measurable by the 4-point probe method or the TLM (transmission line model) method. It may typically be a gold layer. The thickness of this layer may vary from a few nanometers to a few microns depending on the desired sheet resistance but it must, above all, be sufficiently transparent to UV/visible light to let pass at least 10%, better still 50% and ideally 98% of the incident light flux. This layer is for example obtained by vacuum evaporation at $2 \times 10^{-6}$ mbar of a 10 nm layer of gold at a rate of 2 Å/s;

a second positive photoresist 73, for example S1818 from Shipley. The thickness of this layer may vary from a few nanometers to several microns, and ideally is about 1 to 2 µm. The deposition may be carried out by spin coating (at 2000 rpm for 30 seconds for a final thickness of 1.2 μm) or using any other resist deposition technique, followed by a post-deposition anneal at 115° C. for 5 minutes under $N_2$.

Third Step

Figure 3C:
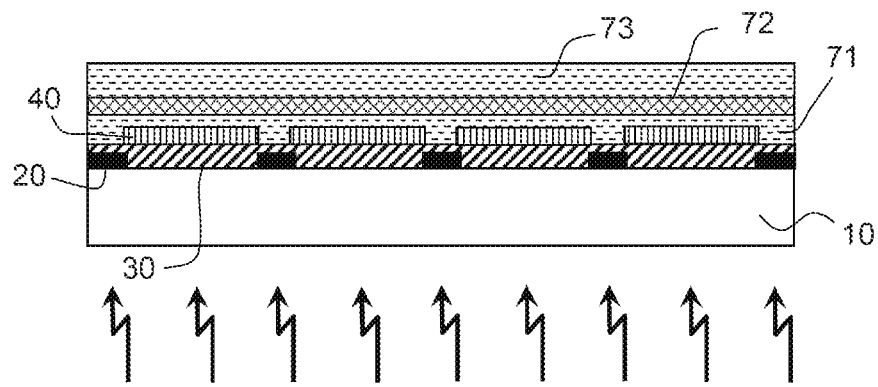

As shown in FIG. 3c, an exposure is performed from the back side of the carrier with an MA750 exposing system. The exposure time may vary from a few tens of seconds to several minutes depending on the transparency of the metal layer 72. For a layer of gold of about 10 nm thickness, exposure for 300 seconds with a dose of 4.3 $mW/cm^2$ is sufficient. This allows, in a single step, the two resist layers 71 and 73 to be exposed and the resist portions that were exposed to the light rays to be made soluble in a suitable solvent.

Fourth Step

Figure 3D:
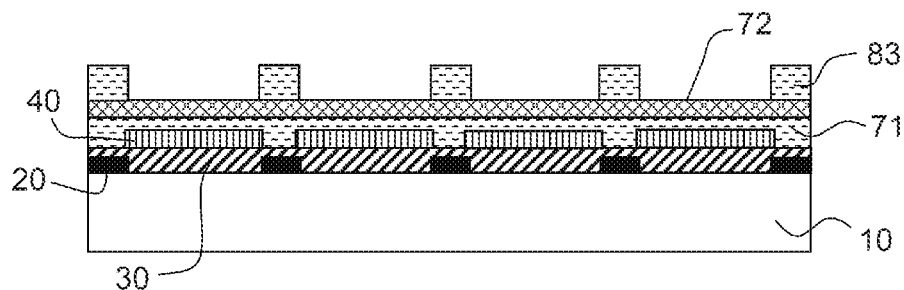

As shown in FIG. 3d, the top resist layer is then developed in a commercial developer based on tetramethyl ammonium hydroxide (about 2% in water) for 1 to 5 mn. Thus an initial portion 83 made of resist of the pads of the mesh is produced on the surface of the metal layer 72.

Fifth Step

Figure 3E:
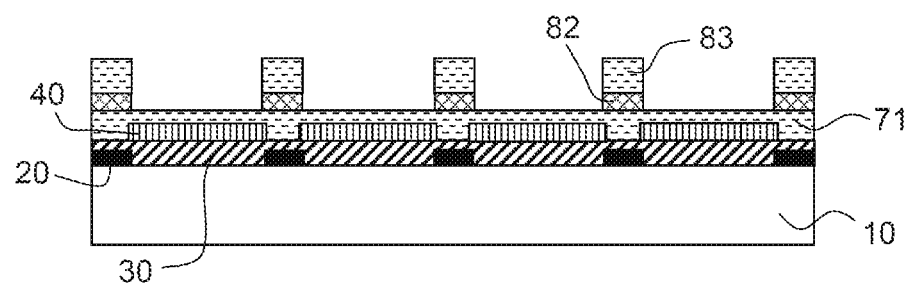

As shown in FIG. 3e, the gold layer is then etched chemically with a $KI/I_2$ solution for 1 to 5 mn then rinsed in deionized water and dried under $N_2$. Thus the metal portions 82 of the pads, surmounted with the portions 83 made of resist of the pads and allowing the mesh to be defined in correspondence with, i.e. facing, the addressing rows/columns 20, are obtained.

Sixth Step

Figure 3F:
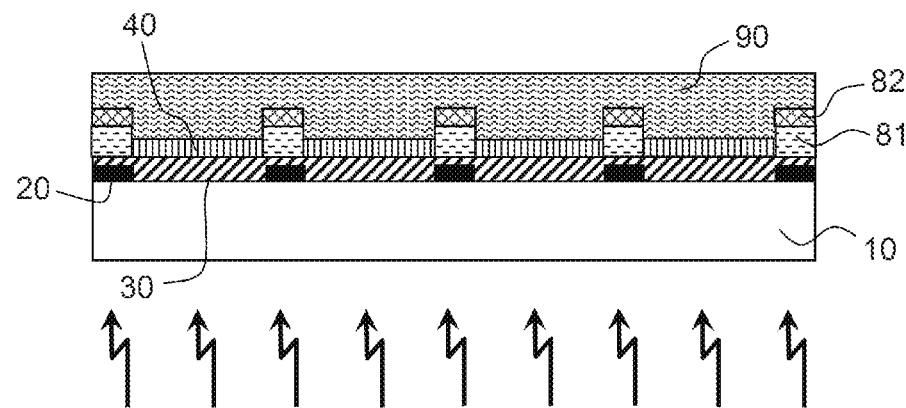

The top portions 83 made of resist of the pads and the resist 71 located level with (facing) the bottom electrodes 40 are then removed, so as to also uncover the latter, by reactive ion etching (RIE) in an oxygen plasma (flow rate of 150 sccm) with 2% $SF_6$ at 10 mtorr and a power of 120 W for 10 minutes. It is then possible to deposit a layer 90 of negative resist, such as the resist SU8 from MicroChem, on the preformed carrier by spin coating, then annealing at 115° C. for 5 minutes. This negative resist 90 may then be exposed from the back side as also shown in FIG. 3f.

Seventh Step

Figure 3G:
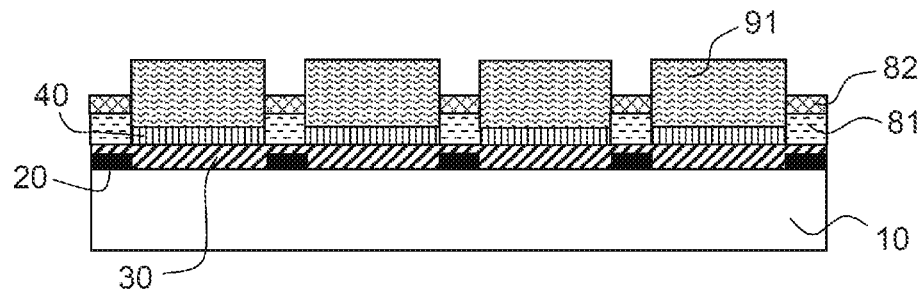

As shown in FIG. 3g, the result of the exposure of the negative photoresist is developed, allowing said negative resist to be removed facing the pads 82/81.

Eighth Step

Figure 3H:
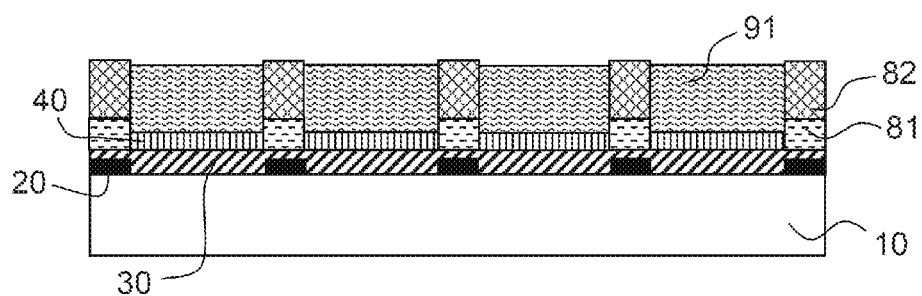

As shown in FIG. 3h, an operation for growing the metal layer is then carried out. To do this, the substrate is submerged in an electrolytic solution in order to make the metal layer grow only above the addressing rows/columns. Different complexes with their advantages and drawbacks exist, the most commonplace being aurocyanure $[Au(CN)_2]^-$. To this complex are added conductive salts $(((NH_4)_2HPO_4, K_2HPO_4$, sodium potassium tartrate, etc.), and buffer salts to stabilize the pH. The carrier is connected to the negative terminal (anode) of a DC voltage generator and the second terminal (cathode) is connected to a platinum (or graphite) electrode. With an electrical current of 20 mA applied for 120 seconds and a deposition area of about 0.8 $cm^2$, the thickness of gold deposited on the carrier may be about 1 μm, which thickness is largely sufficient to obtain a top electrode with an excellent conductivity.

Ninth Step

Figure 3I:
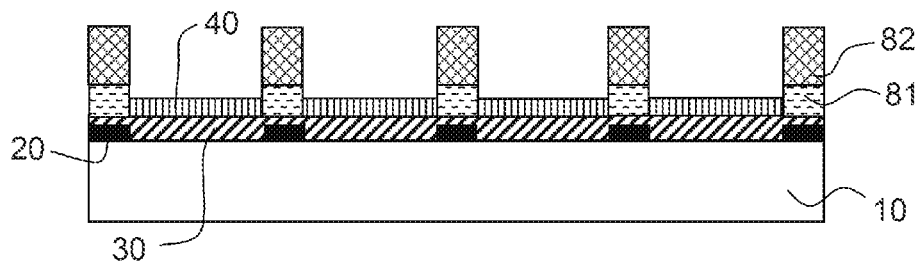

As shown in FIG. 3i, all of the negative-resist patterns remaining on the wafer are then chemically removed by submersion in acetone for 5 to 10 minutes, followed by a rinse in acetone and drying under a flow of $N_2$, leaving the pads 82/81 of the metallic mesh visible.

Once this step has finished, production of the actual photodetector stack may begin.

Tenth Step

Figure 3J:
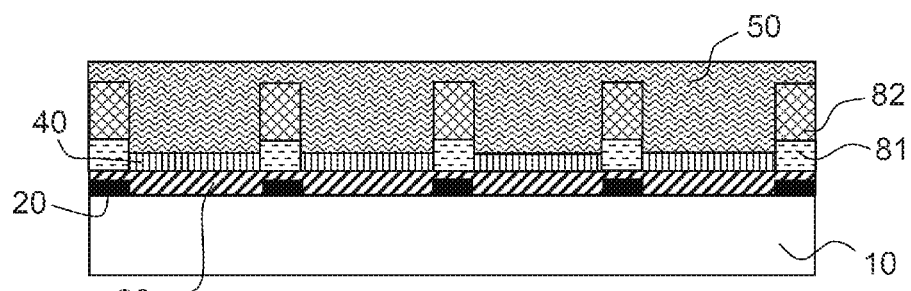

As shown in FIG. 3j, a photosensitive layer 50 composed of a blend of n-type and p-type polymers is then deposited. It may be deposited using techniques such as spin coating or screen printing. The proportion and concentration of the various constituents, and the thickness, the solvent or the combination of solvents used may vary depending on the deposition techniques used, the targeted final performance, the solubility of the various constituents, etc. For example, depositing by spin coating a 1 to 2 blend in xylene (with a concentration of 15 mg/mL of p-type polymer) delivers a thickness of about 250 nm on a glass substrate covered with ITO, for a spin speed of 800 rpm. In the case shown, the thickness of the layer 50 is larger than the height of the pads of the metallic mesh.

Eleventh Step

Figure 3K:
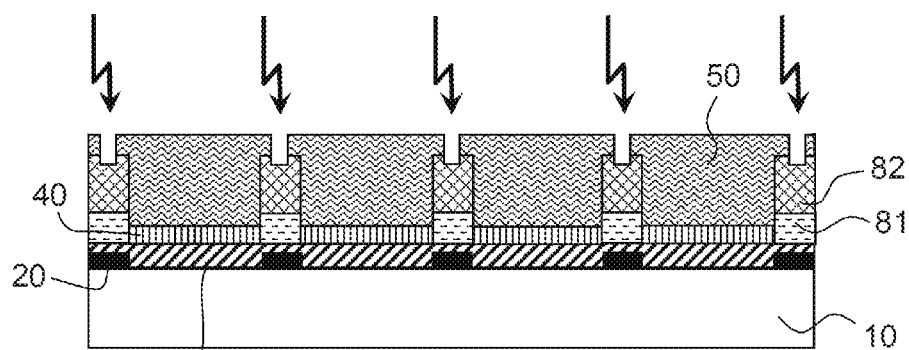

As shown in FIG. 3k, an operation for laser ablating this photosensitive layer 50 is then carried out only level with the addressing rows and columns, in order to uncover the metal layer produced in the preceding steps. The laser ablation may for example be carried out with an Excimer laser: for an active layer of 270 nm thickness, ablation is observed for two laser pulses with a fluence of 440 mJ.

It will be noted that depending on the thickness of the metal layer and in particular if it is too thin, it is possible that the latter will also be etched during the laser ablation. The electrical contact between the top electrode and this metal layer is nonetheless not broken but only made via the flanks of the metal layer.

Twelfth Step

Figure 3L:
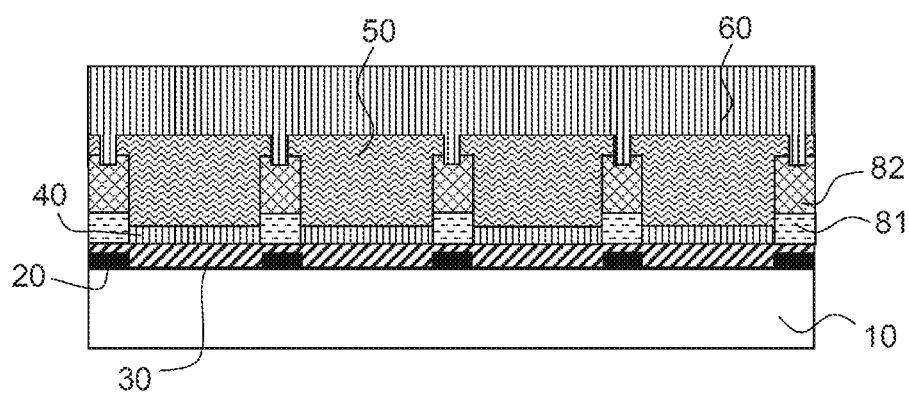

As shown in FIG. 3l, the top electrode 60 is deposited. To do this, as is conventional, the deposited material may be PEDOT/PSS deposited on the wafer scale by suitable deposition techniques such as screen printing, spin coating or even slot-die coating.

This top electrode makes contact with the metallic mesh formed beforehand and thus its sheet resistance is spectacularly decreased.

Second Exemplary Process for Manufacturing a Matrix-Array Photodetecting Device According to the Invention It is possible to remove the step of electrolytic growth if the conductivity of the metal layer is sufficient and in particular in the case of a thick metal layer. The main advantage of this variant is to decrease the number of production steps since a negative resist, a second photolithography step and an electrodeposition step are not necessary.

This process comprises first steps similar to those of the first exemplary process and illustrated in FIG. 3a.

Figure 4A:
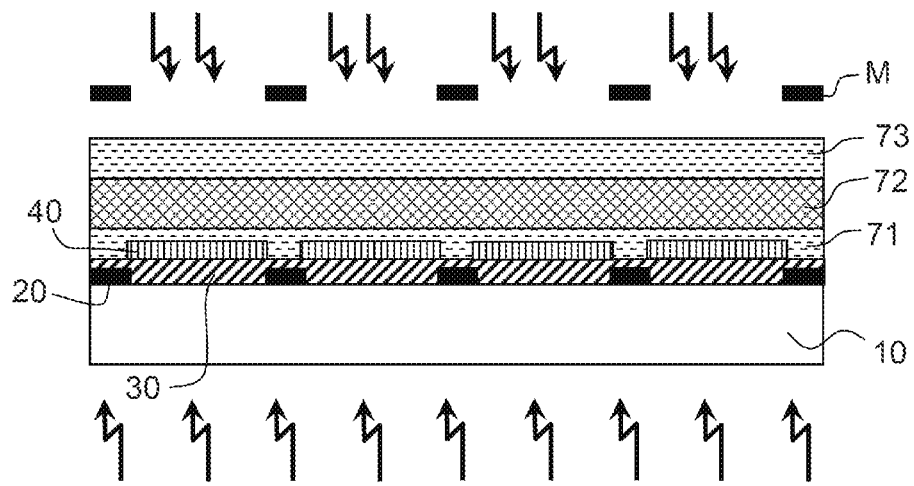
FIGS. 4a to 4c illustrate the various steps of a second exemplary process for producing a device of the invention.

In the present example, a thick metal layer allowing a very good conductivity to be obtained is then deposited as illustrated in FIG. 4a. The preformed carrier is exposed from the front side through a mask M and from the back side (without a mask).

Figure 4B:
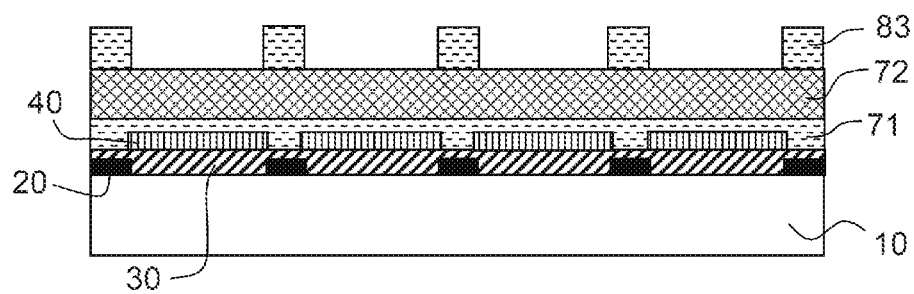

As in the first exemplary process, the top portions 83 made of resist are developed, leaving the thick metal layer locally uncovered as illustrated in FIG. 4b.

Figure 4C:
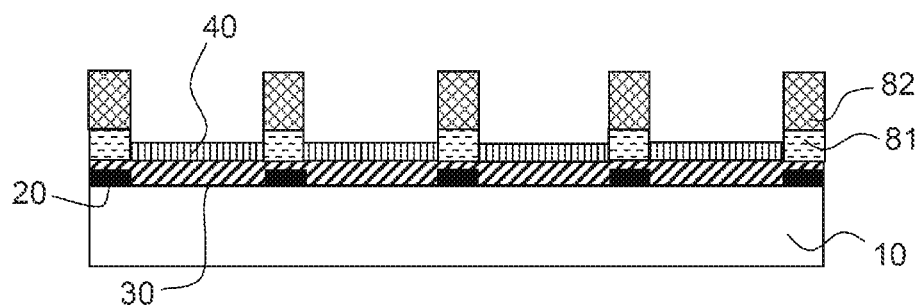

Next, the thick metal layer is etched and then the top resist layer is etched using methods identical to those described above so as to form the pads of the mesh comprising a metal top portion 82 above a resist portion 81, as shown in FIG. 4c.

The subsequent steps of the process may then be identical to those of the first exemplary process of the invention.

According to one variant of the invention, it is also advantageously possible to then de-wet the photosensitive layer 50 on the metal pads 82, allowing the step of laser ablation of the photosensitive layer 50 level with the addressing rows and columns to be removed. To do this, it is possible to submerge the carrier for 10 minutes in a 1% solution of 1H,1H,2H,2H-perfluorodecanethiol in water.

Generally, it will thus be clear that the fabricating process of the present invention allows a mesh of rows/columns that has the aim of decreasing the parasitic capacitances between the top electrode of an active matrix array of photodetectors and the rows/columns for controlling the transistors of this matrix array to be produced. It also allows, without loss of active area, the sheet resistance of the top electrode to be notably decreased using a mesh of metallic rows/columns connected to the top electrode.

The invention claimed is:

1. A matrix-array detecting device including a stack comprising a matrix array of detecting-element pixels, and an active matrix array comprising a network of rows and columns for controlling the pixels and produced on the surface of a substrate, wherein:
   the detecting-element pixels comprise:
      a common top electrode;
      a detecting layer; and
      discrete bottom electrodes;
   said device comprising a metallic mesh:
      that is connected to said top electrode;
      that includes pads comprising at least one metal portion, said pads being incorporated into said detecting layer; and
      that is positioned in correspondence with said network of controlling rows and columns,
   wherein at least one of said pads comprises a metal top portion and a bottom portion comprising a dielectric,
   wherein the metal top portion is in contact with the common top electrode.

2. The matrix-array detecting device as claimed in claim 1, wherein the detecting layer is a common detecting layer.

3. The matrix-array detecting device as claimed in claim 1, wherein the detecting pixels are photodiodes.

4. The matrix-array detecting device as claimed in claim 1, wherein the metallic mesh is separated from the network of controlling rows and columns by a dielectric layer of permittivity lower than about 2.5.

5. The matrix-array detecting device as claimed in claim 1, wherein the bottom portion of said pads includes a positive photoresist.

6. The matrix-array detecting device as claimed in claim 1, wherein detecting-element pixels comprise one or more organic materials.

7. The matrix-array detecting device as claimed in claim 6, wherein the organic material is a blend of p-type polymer and n-type polymer.

8. The matrix-array detecting device as claimed in claim 1, wherein the network of rows and columns for controlling said pixels is connected to a network of controlling transistors.

* * * * *